(12) United States Patent
Lee et al.

(10) Patent No.: US 10,964,704 B2
(45) Date of Patent: Mar. 30, 2021

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Hyun-Jung Lee, Seongnam-si (KR); Joon-Seok Moon, Seongnam-si (KR); Dongsoo Woo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/550,192

(22) Filed: Aug. 24, 2019

(65) Prior Publication Data

US 2020/0219884 A1 Jul. 9, 2020

(30) Foreign Application Priority Data

Jan. 3, 2019 (KR) .................. 10-2019-0000912

(51) Int. Cl.

| | |
|---|---|
| *H01L 27/108* | (2006.01) |
| *H01L 29/06* | (2006.01) |
| *H01L 21/28* | (2006.01) |
| *H01L 21/3213* | (2006.01) |
| *H01L 29/49* | (2006.01) |

(52) U.S. Cl.
CPC .. *H01L 27/10823* (2013.01); *H01L 21/28088* (2013.01); *H01L 21/32133* (2013.01); *H01L 27/10814* (2013.01); *H01L 27/10876* (2013.01); *H01L 29/0649* (2013.01); *H01L 29/4966* (2013.01)

(58) Field of Classification Search
None
See application file for complete search history.

(56) References Cited

U.S. PATENT DOCUMENTS

| | | |
|---|---|---|
| 8,901,630 B2 | 12/2014 | Huh et al. |
| 9,178,039 B2 | 11/2015 | Park et al. |
| 9,306,022 B1 | 4/2016 | Oh |
| 9,508,847 B2 | 11/2016 | Oh et al. |
| 9,530,849 B2 | 12/2016 | Oh et al. |
| 9,589,960 B1 | 3/2017 | Min |
| 9,634,011 B2 | 4/2017 | Kang et al. |
| 9,704,988 B2 | 7/2017 | Oh |
| 9,748,248 B2 | 8/2017 | Kang |
| 10,312,243 B2 * | 6/2019 | Lee ..................... H01L 29/4983 |

(Continued)

*Primary Examiner* — Alexander G Ghyka
(74) *Attorney, Agent, or Firm* — Volentine, Whitt & Francos, PLLC

(57) ABSTRACT

A semicondcutor device, and a method of fabricating the semiconductor device including forming on a substrate a device isolation layer defining a plurality of active regions; and forming a plurality of gate lines intersecting the active regions and buried in the substrate. The forming of the gate lines includes forming on the substrate a trench that intersects the active regions; forming a work-function control layer on a sidewall and a bottom surface of the trench; forming a conductive layer on the work-function control layer; sequentially forming a barrier layer and a source layer on the work-function control layer and the conductive layer, the source layer including a work-function control element; and diffusing the work-function control element from the source layer into an upper portion of the work-function control layer.

20 Claims, 21 Drawing Sheets

(56) References Cited

U.S. PATENT DOCUMENTS

| | | | |
|---|---|---|---|
| 10,818,672 B2* | 10/2020 | Lee | ................... H01L 29/66659 |
| 2014/0036777 A1 | 12/2014 | Yoo et al. | |
| 2015/0349073 A1* | 12/2015 | Kang | ................ H01L 27/10891 |
| | | | 257/330 |
| 2017/0186844 A1* | 6/2017 | Kim | ...................... H01L 29/517 |
| 2018/0174845 A1 | 6/2018 | Jang et al. | |
| 2019/0115351 A1* | 4/2019 | Jeon | ................. H01L 27/10891 |
| 2019/0244820 A1* | 8/2019 | Jang | ................... H01L 29/7827 |
| 2019/0333769 A1* | 10/2019 | Chen | ................... H01L 29/4966 |
| 2020/0152754 A1* | 5/2020 | Kim | ...................... H01L 29/511 |
| 2020/0335404 A1* | 10/2020 | Lee | ................ H01L 21/823842 |

\* cited by examiner

SEMICONDUCTOR DEVICE AND METHOD OF FABRICATING THE SAME

CROSS-REFERENCE TO RELATED APPLICATION

A claim of priority under 35 U.S.C. § 119 is made to Korean Patent Application No. 10-2019-0000912 filed on Jan. 3, 2019 in the Korean Intellectual Property Office, the entire contents of which are hereby incorporated by reference.

BACKGROUND

The present inventive concepts relate generally to a semiconductor device and a method of fabricating the same, and more particularly to a semiconductor device including buried gate lines and a method of fabricating the same.

Semiconductor devices are important in the electronic industry because semiconductor devices typically have small size and multi-functionality, and/or are inexpensive to fabricate. Semiconductor devices may be categorized as any one of semiconductor memory devices storing logic data, semiconductor logic devices processing operations of logic data, and hybrid semiconductor devices having both memory and logic elements.

In view of increasing demand for high speed electronic products having low power consumption, semiconductor devices embedded in electronic products are typically designed to have high operating speed and/or low operating voltage. As a consequence, semiconductor devices have become more highly integrated with reduced reliability. However, with the advancement of the electronic industry, there is increased demand for highly reliable semiconductor devices. Accordingly, research effort has been focused on enhancing reliability of semiconductor devices.

SUMMARY

Embodiments of the inventive concepts provide a semiconductor device with improved electrical characteristics and a method of fabricating the same.

Some embodiments of the inventive concepts provide a method of fabricating a semiconductor device, which method reduces fabrication failure.

Embodiments of the inventive concepts provide a method of fabricating a semiconductor device including forming a device isolation layer on a substrate, the device isolation layer defining a plurality of active regions; and forming a plurality of gate lines intersecting the active regions and buried in the substrate. The forming of a gate line from among the plurality of gate lines may includes forming on the substrate a trench intersecting the active regions; forming a work-function control layer on a sidewall and a bottom surface of the trench; forming a conductive layer on the work-function control layer; sequentially forming a barrier layer and a source layer on the work-function control layer and on the conductive layer, the source layer including a work-function control element; and diffusing the work-function control element from the source layer into an upper portion of the work-function control layer.

Embodiments of the inventive concepts further provide a semiconductor device including a device isolation layer defining a plurality of active regions of a substrate; and a plurality gate lines intersecting the active regions and buried in the substrate. A gate line of the gate lines may includes a work-function control layer covering a sidewall of a lower portion of trench in the substrate, the trench intersecting the active regions; and a conductive layer on the work-function control layer and filling the lower portion of the trench. The work-function control layer may includes a first work-function control part surrounding a lateral surface of the conductive layer; and a second work-function control part on the first work-function control part and covering a portion of the lateral surface and a top surface of the conductive layer.

Embodiments of the inventive concepts still further provide a method of fabricating a semiconductor device including forming a gate dielectric pattern on a bottom surface and a lateral surface of a trench in a substrate; forming a gate line on the gate dielectric pattern, the gate line filling a lower portion of the trench and including a conductive layer and a work-function control layer surrounding a lateral surface of the conductive layer; forming a barrier layer on an exposed inner surface of the gate dielectric pattern; forming a source layer on the barrier layer, the source layer covering the gate line and including a work-function control element; and diffusing the work-function control element from the source layer to an upper portion of the work function control layer so that a work function of the upper portion of the work-function control layer is lower than work function of a lower portion of the work-function control layer.

BRIEF DESCRIPTION OF THE DRAWINGS

Embodiments of the inventive concepts will be described in detail with reference to the accompanying drawings.

DETAILED DESCRIPTION OF EMBODIMENTS

Figure 1:
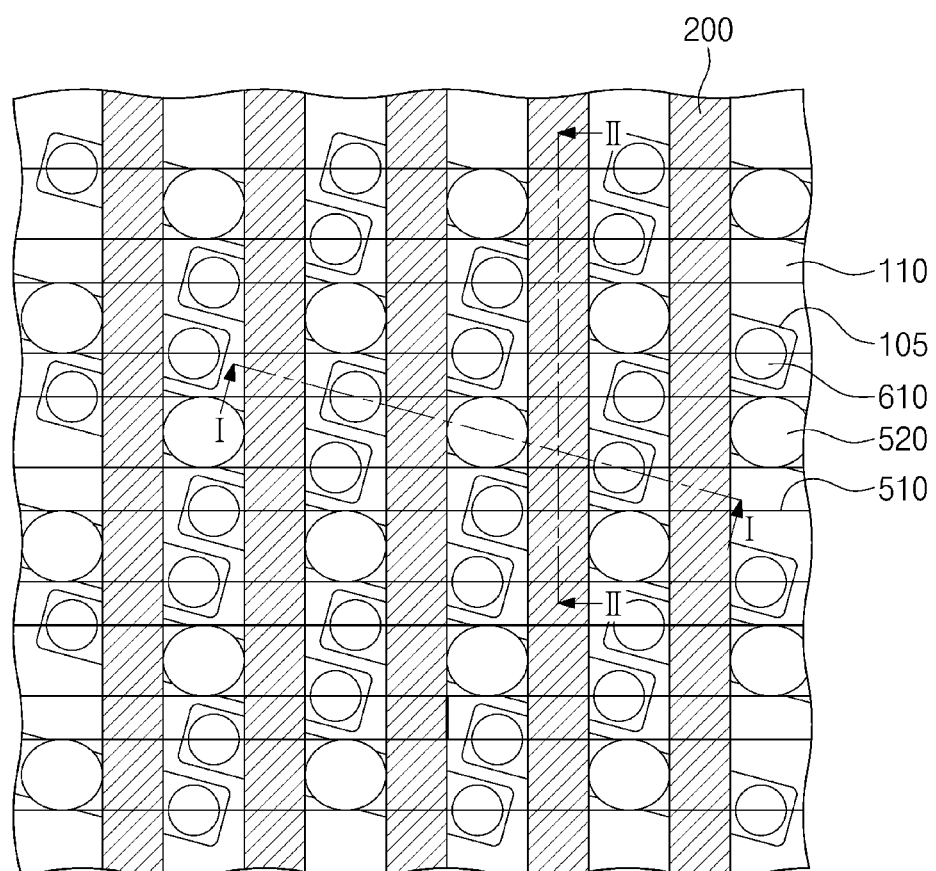
FIG. 1 illustrates a plan view of a semiconductor device according to embodiments of the inventive concepts.
Figure 1:
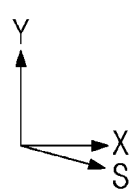

A semiconductor device and a fabrication method according to embodiments of the inventive concepts will be hereinafter described with reference to the accompanying drawings. Like reference numerals may indicate like components throughout the description.

Figure 2A:
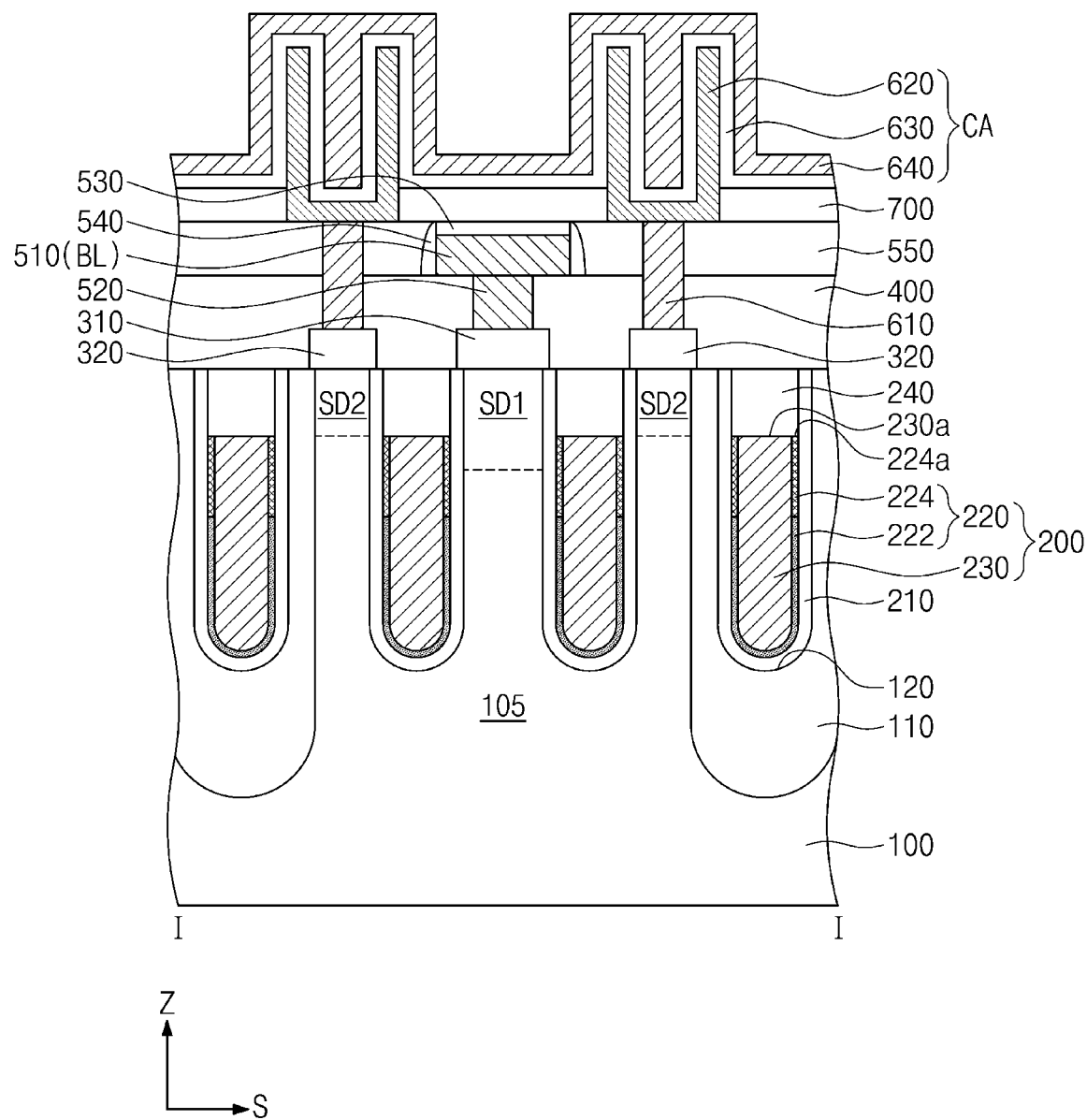
FIGS. 2A and 2B illustrate cross-sectional views of a semiconductor device respectively taken along lines I-I and II-II of FIG. 1, according to embodiments of the inventive concepts.
Figure 2B:
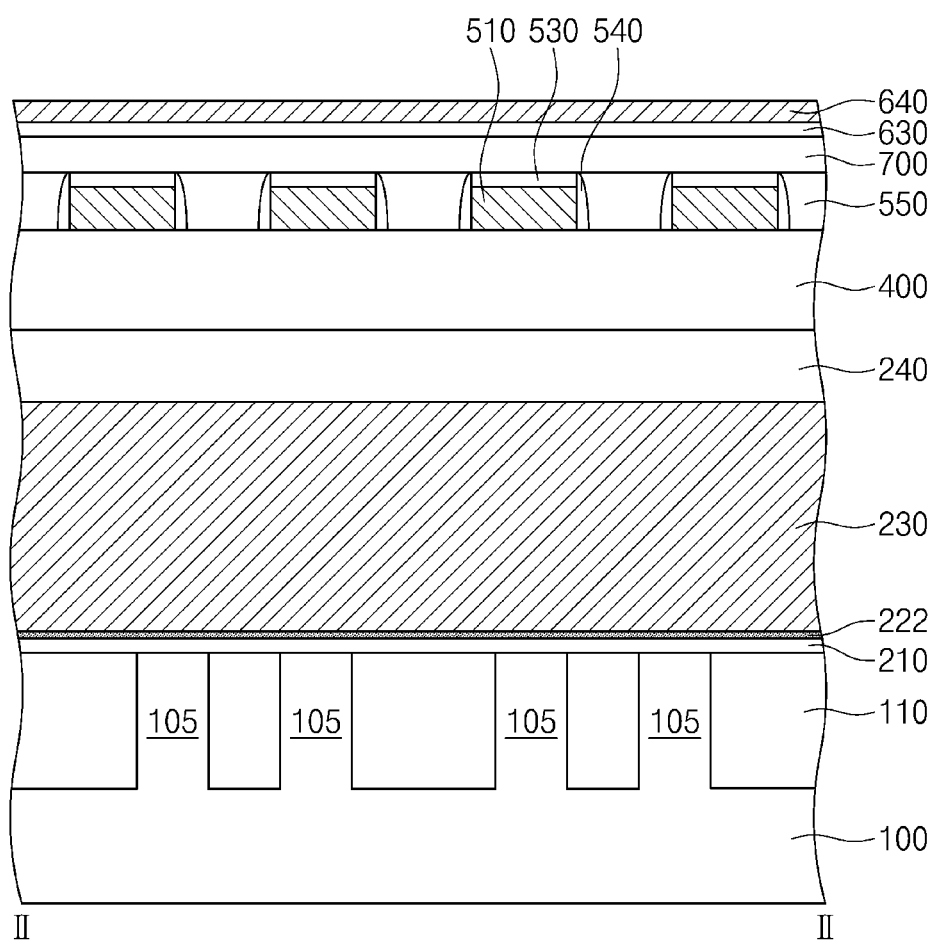
Figure 3A:
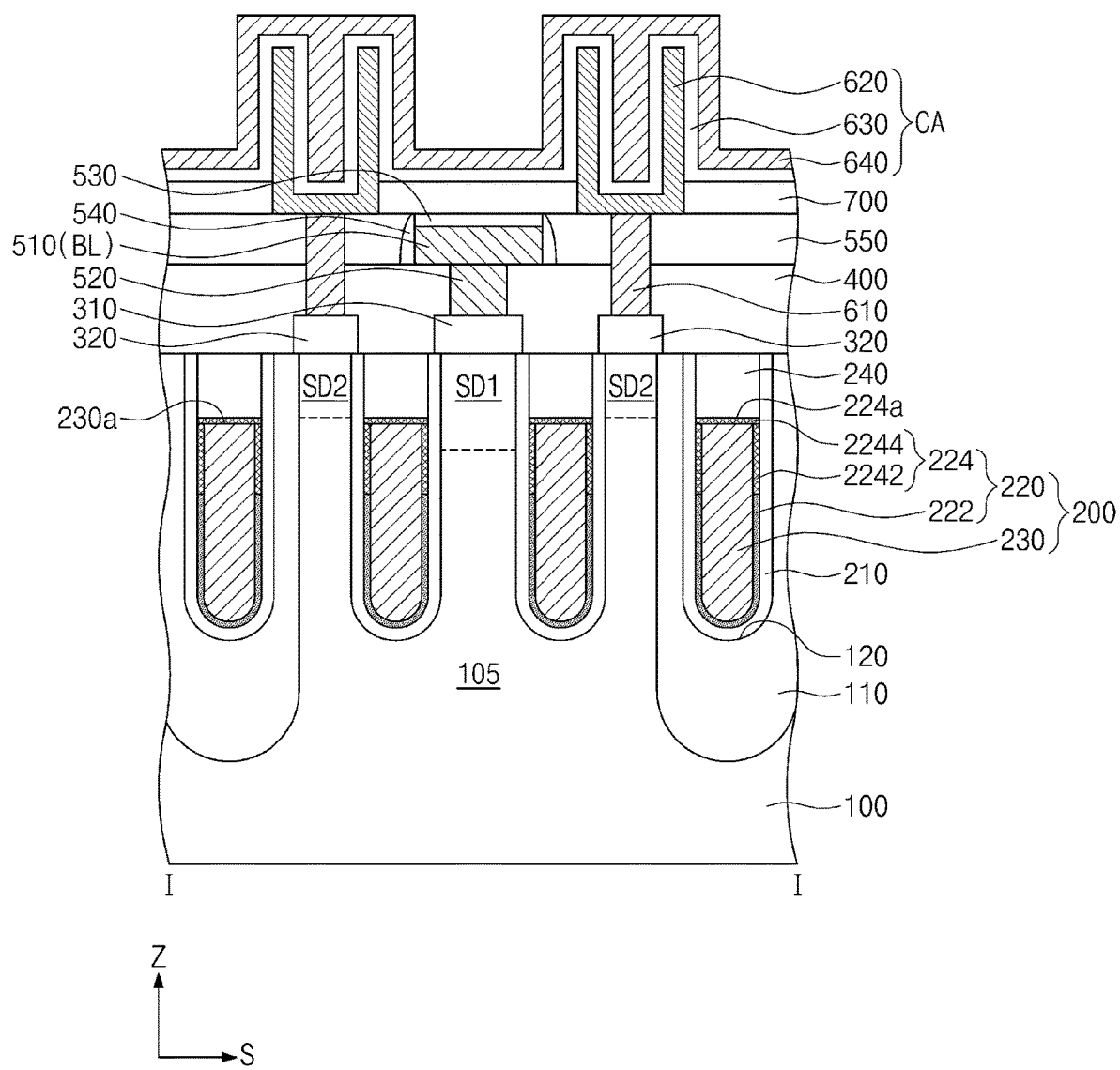
FIGS. 3A and 3B illustrate cross-sectional views of a semiconductor device respectively taken along lines I-I and II-II of FIG. 1, according to other embodiments of the inventive concepts.
Figure 3B:
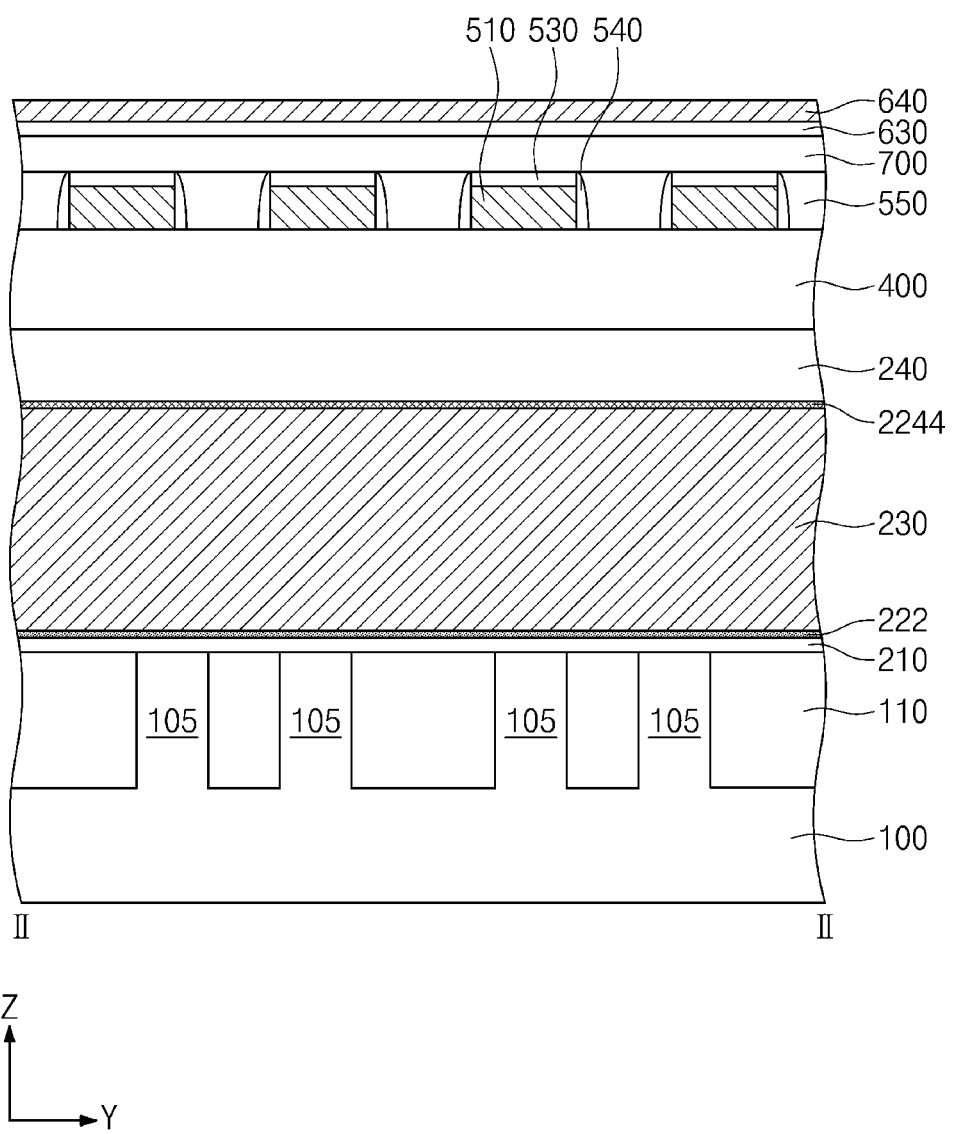

FIG. 1 illustrates a plan view of a semiconductor device according to example embodiments of the inventive concepts. FIGS. 2A and 2B illustrate cross-sectional views of a semiconductor device respectively taken along lines I-I and II-II of FIG. 1, according to embodiments of the inventive concepts. FIGS. 3A and 3B illustrate cross-sectional views of a semiconductor device respectively taken along lines I-I and II-II of FIG. 1, according to other embodiments of the inventive concepts.

Referring to FIGS. 1, 2A, and 2B, the semiconductor device includes a substrate 100 having a device isolation layer 110 provided therein defining active regions 105. The substrate 100 may include a semiconductor substrate. For example, the substrate 100 may be a silicon (Si) substrate, a germanium (Ge) substrate, or a silicon-germanium (SiGe) substrate. The active regions 105 may each have a bar shape having a major axis aligned in a third direction S intersecting first and second directions X and Y that are perpendicular to each other. A fourth direction Z is perpendicular to the first, second, and third directions X, Y, and S. FIG. 2A illustrates a cross-section of the semiconductor device in the third and fourth directions S and Z, and FIG. 2B illustrates a cross-section of the semiconductor device in the second and fourth directions Y and Z.

A plurality of gate lines 200 are provided in the substrate 100 intersecting the active regions 105, when viewed in plan. The gate lines 200 may be word lines. The gate lines 200 extend in the second direction Y, and are arranged parallel to each other and spaced apart from each other in the first direction X. The gate lines 200 may be buried gate lines formed in the substrate 100. For example, the gate lines 200 may be disposed in trenches 120 of the substrate 100 that extend along the second Y direction and intersect the active regions 105. The gate lines 200 may partially fill the trenches 120. Top surfaces of the gate lines 200 may be at a lower level than a top surface of the substrate 100. In embodiments of the inventive concepts, a lower portion of the gate line 200 has a higher work function, and an upper portion of the gate line 200 has a lower work function. This will be further described in detail hereinafter together with configurations of the gate lines 200. The gate line 200 may include a work-function control layer 220 and a conductive layer 230.

The conductive layer 230 may be disposed in the trench 120. The conductive layer 230 may partially gap-fill the trench 120. The conductive layer 230 may include a material having low resistance. For example, the conductive layer 230 may include metal such as tungsten (W), titanium (Ti), or tantalum (Ta), or conductive metal nitride such as tungsten nitride (WN). The conductive layer 230 may reduce resistance of the gate line 200.

The work-function control layer 220 may conformally cover the trench 120 of the substrate 100. For example, the work-function control layer 220 may cover a sidewall and a bottom surface of the trench 120. The work-function control layer 220 may be interposed between the conductive layer 230 and an inner wall of the trench 120. For example, the work-function control layer 220 may separate the conductive layer 230 from the inner wall of the trench 120, and the conductive layer 230 may thus fill the trench 120 as disposed at and in contact with an inward surface of the work-function control layer 220. The work-function control layer 220 may have a U-shaped cross-section depending on the shape of the trench 120 and the conductive layer 230. The work-function control layer 220 may have higher resistance than that of the conductive layer 230.

The work-function control layer 220 may be a liner layer provided for controlling the work function of the gate line 200. The work-function control layer 220 may have a lower work function than the work function of the conductive layer 230. As another example, in some embodiments the work-function control layer 220 may have a work function the same as or higher than the work function of the conductive layer 230, although the inventive concepts are not limited thereto. The work-function control layer 220 may have a first work-function control part 222 and a second work-function control part 224.

The first work-function control part 222 may cover a lower portion of the trench 120. The first work-function control part 222 may surround a lower portion of the conductive layer 230. The first work-function control part 222 may include nitride of a metallic material, or metal nitride. The metallic material may include a metal element different from a work-function control element, as will be described hereinafter. For example, the metallic material may include a metal element such as titanium (Ti) or tantalum (Ta). For example, the metal nitride may include titanium nitride (TiN), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN).

The second work-function control part 224 may be provided on the first work-function control part 222. That is, the second work-function control part 224 may have a lowermost end in contact with an uppermost end of the first work-function control part 222. The second work-function control part 224 may partially cover an upper portion of the trench 120. The second work-function control part 224 may surround an upper portion of the conductive layer 230. The second work-function control part 224 may include a metallic material doped with a work-function control element, or may include metal nitride, i.e., nitride of the metallic material doped with the work-function control element. The metallic material may include a metal element different from the work-function control element. For example, the metallic material may include a metal element such as titanium (Ti) or tantalum (Ta). For example, the metal nitride may include titanium nitride (TiN), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN).

In this description, the work-function control element may be defined to refer to an element capable of changing a work function of metal or metal nitride. For example, the work-function control element may include metal such as one or more of lanthanum (La), strontium (Sr), antimony (Sb), yttrium (Y), aluminum (Al), tantalum (Ta), hafnium (Hf), iridium (Ir), zirconium (Zr), and magnesium (Mg). The work-function control element however should not be limited to the above described example. The second work-function control part 224 doped with the work-function control element may have a lower work function than that the first work-function control part 222 that is not doped with a work-function control element. The first work-function control part 222 and the second work-function control part 224 may each have a lower work function than that of the conductive layer 230.

According to some embodiments of the inventive concepts, the semiconductor device may include the work-function control layer 220 having a portion (i.e., the second work-function control part 224 on the upper portion of the gate line 200) that has a lower work function to reduce a gate induced drain leakage (GIDL) current flowing from the upper portion of the gate line 200 toward impurity regions SD1 and SD2, which will be described hereinafter. Moreover, a doping concentration of the second work-function control part 224 may be controlled to adjust the work function of the upper portion of the gate line 200. Therefore, it may be easy to provide the gate line 200 with a required lower work function.

Furthermore, according to some embodiments of the inventive concepts, the work function may be reduced at the upper portion of the gate line 200 to decrease the GIDL current, whereas the work function at the lower portion of the gate line 200 may not be reduced so that the semiconductor device may maintain a higher threshold voltage at the lower portion of the gate line 200 (i.e., at the first work-function control part 222 below which a channel is formed).

As shown in FIGS. 2A and 2B, the work-function control layer 220 and the conductive layer 230 may have their uppermost end at a same level. For example, the second work-function control part 224 of the work-function control layer 220 may have a top surface 224a coplanar with a top surface 230a of the conductive layer 230. The top surface 230a of the conductive layer 230 may be exposed on the top surface 224a of the second work-function control part 224 of the work-function control layer 220. The top surface 224a of the work-function control layer 220 and the top surface 230a of the conductive layer 230 may be located at a lower level than that of the top surface of the substrate 100. Although not shown, the top surface 230a of the conductive layer 230 may be provided at a higher level than that of the top surface 224a of the second work-function control part 224. In this case, the upper portion of the conductive layer 230 may protrude above the top surface 224a of the second work-function control part 224.

In other embodiments, as shown in FIGS. 3A and 3B, the top surface 224a of the second work-function control part 224 of the work-function control layer 220 may be provided at a higher level than that of the top surface 230a of the conductive layer 230. In this case, the second work-function control part 224 may have an upper segment 2244 that extends onto the top surface 230a of the conductive layer 230, and may downwardly cover the conductive layer 230. For example, a lower segment 2242 of the second work-function control part 224 may cover a lateral surface of the conductive layer 230, and the upper segment 2244 of the second work-function control part 224 may cover the top surface 230a of the conductive layer 230. The top surface 230a of the conductive layer 230 may not be exposed by the upper segment 2244 of the second work-function control part 224. When the lower segment 2242 and the upper segment 2244 of the second work-function control part 224 include the same material, the lower segment 2242 and the upper segment 2244 of the second work-function control part 224 may have a continuous configuration and an invisible interface therebetween. For example, the lower segment 2242 and the upper segment 2244 of the second work-function control part 224 may be integrally connected into a single body. Alternatively, when the lower segment 2242 and the upper segment 2244 of the second work-function control part 224 include different materials, a visible interface may be located between the lower segment 2242 and the upper segment 2244 of the second work-function control part 224. Accordingly, all of the upper portion of the conductive layer 230 may be covered with the second work-function control part 224 having the lower work function, and thus the upper portion of the gate line 200 may have a reduced work function. It may thus be possible to reduce the GIDL current flowing from the upper portion of the gate line 200 toward impurity regions SD1 and SD2, which will be described hereinafter.

Referring back to FIGS. 1, 2A, and 2B, gate dielectric patterns 210 may be interposed between the gate lines 200 and the active regions 105, and also between the gate lines 200 and the device isolation layer 110. The gate dielectric pattern 210 may cover the sidewall and the bottom surface of the trench 120. The gate dielectric patterns 210 may separate the gate lines 200 from the substrate 100. For example, the gate dielectric patterns 210 may include one or more of silicon oxide (SiOx), silicon nitride (SiNx), and silicon oxynitride (SiON).

First capping patterns 240 may be disposed on the gate lines 200. The first capping patterns 240 may have top surfaces coplanar with the top surface of the substrate 100. For example, the first capping patterns 240 may include one or more of silicon oxide (SiOx), silicon nitride (SiNx), and silicon oxynitride (SiON). Although not shown, in some embodiments the first capping patterns 240 may have a bottom surface in contact with a top surface of the gate dielectric pattern 210, and opposite lateral surfaces in contact with the active regions 105 and/or the device isolation layer 110. In other embodiments such as shown in FIG. 2A for example, the gate dielectric patterns 210 may extend between the first capping patterns 240 and the active regions 105, and/or between the first capping patterns 240 and the device isolation layer 110. The gate dielectric patterns 210 between the first capping patterns 240 and the active regions 105 may serve as buffers that reduce stress between the first capping patterns 240 and the active regions 105.

A first impurity region SD1 and a second impurity region SD2 may be disposed in the active regions 105 adjacent to opposite lateral surfaces of the gate line 200. The first and second impurity regions SD1 and SD2 may extend into an inside of the substrate 100 from the top surface of the substrate 100. The first and second impurity regions SD1 and SD2 have conductive types different from that of the substrate 100. For example, if the substrate 100 is P-type, the first and second impurity regions SD1 and SD2 may be N-type. The first impurity region SD1 and the second impurity region SD2 may respectively correspond to a source region or a drain region.

The first pads 310 may be disposed on the substrate 100 as connected to the first impurity regions SD1. The second pads 320 may also be disposed on the substrate 100 as connected to the second impurity regions SD2. The first and second pads 310 and 320 may include a conductive material, such as metal or doped polysilicon.

A first interlayer dielectric layer 400 may be disposed on the first and second pads 310 and 320. The first interlayer dielectric layer 400 may include one or more of silicon oxide (SiOx), silicon nitride (SiNx), and silicon oxynitride (SiON). Bit lines 510 may be disposed on the first interlayer dielectric layer 400. The bit lines 510 may be provided in a second interlayer dielectric layer 550 on the first interlayer dielectric layer 400. The second interlayer dielectric layer 550 may include one or more of silicon oxide (SiOx), silicon nitride (SiNx), and silicon oxynitride (SiON). The bit lines 510 may be connected to direct contacts 520 that penetrate the first interlayer dielectric layer 400 and have connection with the first pads 310. The bit lines 510 and the direct contacts 520 may include one of doped semiconductor materials (e.g., doped silicon or doped germanium), conductive metal nitrides (e.g., titanium nitride (TiN) or tantalum nitride (TaN)), metals (e.g., tungsten (W), titanium (Ti), or tantalum (Ta)), and metal-semiconductor compounds (e.g., tungsten silicide ($WSi_2$), cobalt silicide (CoSi), or titanium silicide (TiSi)). Second capping patterns 530 may be disposed on the bit lines 510, and dielectric spacers 540 may cover opposite sidewalls of each bit line 510. The second capping patterns 530 and the dielectric spacers 540 may include one or more of silicon oxide (SiOx), silicon nitride (SiNx), and silicon oxynitride (SiON).

Buried contacts 610 may be provided on the substrate 100 and may penetrate the first and second interlayer dielectric layers 400 and 550 and have connection with the second pads 320. The buried contacts 610 may include a conductive material, such as metal or doped silicon. Data storage elements may be provided on the second interlayer dielectric layer 550 as connected to the buried contacts 610. For example, the data storage elements may be capacitors CA. The capacitor CA may include a first electrode 620, a second electrode 640, and a dielectric layer 630 between the first and second electrodes 620 and 640. The first electrodes 620 may have a cylindrical shape with a closed bottom. The second electrode 640 may be a common electrode commonly covering the first electrodes 620. The first and second electrodes 620 and 640 may include doped silicon, metal, or metal compound. A support layer 700 may be disposed between the second electrode 640 and the second interlayer dielectric layer 550. The support layer 700 may abut with an outer sidewall of the first electrodes 620 to prevent collapse of the first electrodes 620. The support layer 700 may include a dielectric material. The dielectric layer 630 may extend in one direction to lie between the support layer 700 and the second electrode 640.

The structure shown in FIGS. 3A and 3B is respectively the same as the structure shown in FIGS. 2A and 2B, except that in FIGS. 3A and 3B the second work-function control part 224 includes upper segment 2244 and lower segment 2242 as previously described. Description of structure in FIGS. 3A and 3B that is the same as in FIGS. 2A and 2B has been omitted for the sake of brevity.

FIGS. 4A to 12A illustrate cross-sectional views taken along line I-I of FIG. 1, showing a method of fabricating a semiconductor device according to embodiments of the inventive concepts. FIGS. 4B to 12B illustrate cross-sectional views taken along line II-II of FIG. 1, showing a method of fabricating a semiconductor device according to embodiments of the inventive concepts. FIG. 9C illustrates an enlarged cross-sectional view showing section A of FIG. 9A.

Figure 4A:
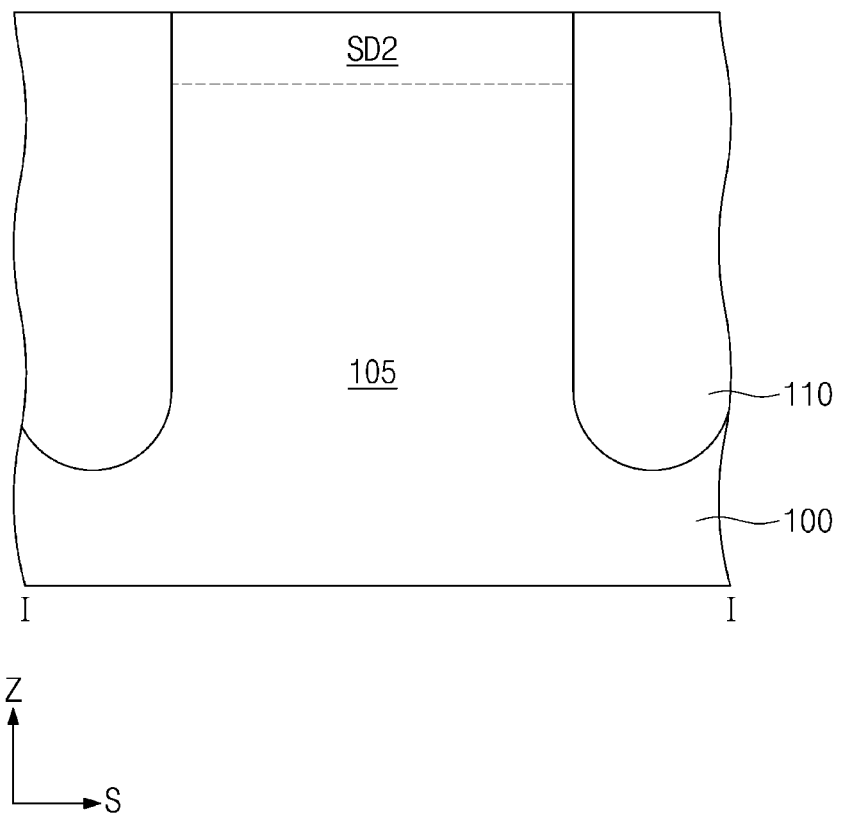
FIGS. 4A and 4B illustrate cross-sectional views respectively taken along lines I-I and II-II of FIG. 1, showing a method of fabricating a semiconductor device according to embodiments of the inventive concepts.
Figure 4B:
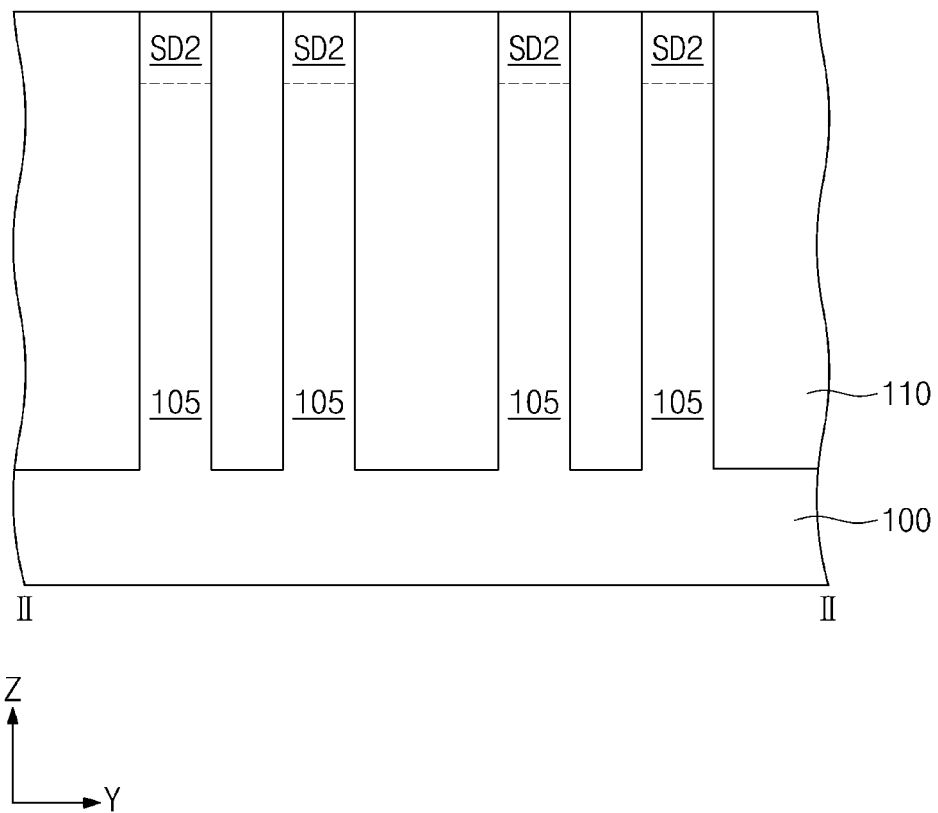

Referring to FIGS. 4A and 4B, a device isolation layer 110 is formed in a substrate 100, thereby defining active regions 105. For example, a Shallow Trench Isolation (STI) process may be used to form the device isolation layer 110. The device isolation layer 110 may include one or more of silicon oxide (SiOx), silicon nitride (SiNx), and silicon oxynitride (SiON). The device isolation layer 110 may be formed to extend into the substrate 100.

Second impurity regions SD2 are formed in the active regions 105 of the substrate 100. An ion implantation process may be employed to form the second impurity regions SD2. For example, the second impurity regions SD2 may be areas implanted with N-type dopants.

Figure 5A:
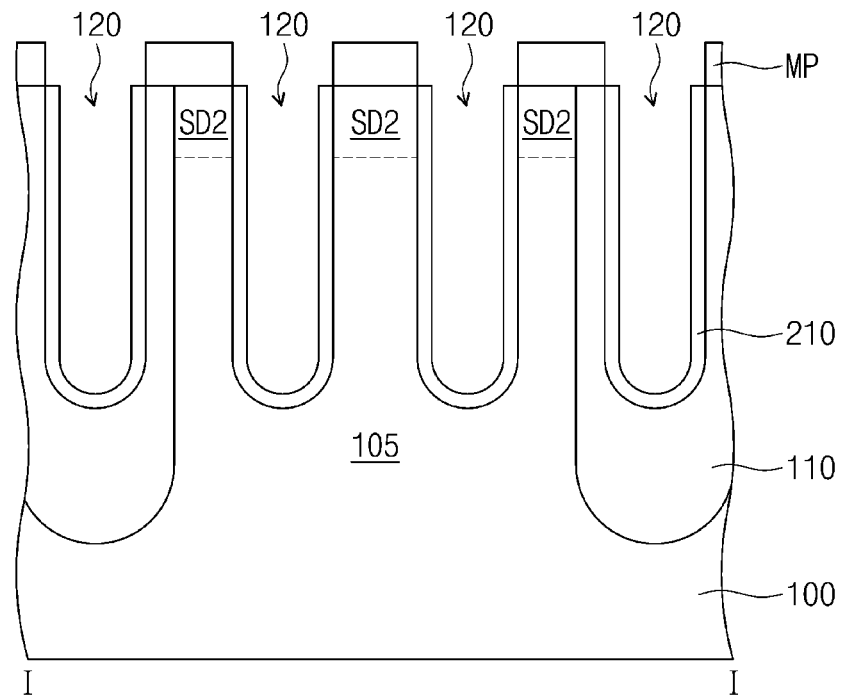
FIGS. 5A and 5B illustrate cross-sectional views respectively taken along lines I-I and II-II of FIG. 1, showing a method of fabricating a semiconductor device according to embodiments of the inventive concepts.
Figure 5A:
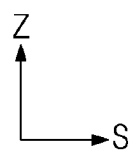
Figure 5B:
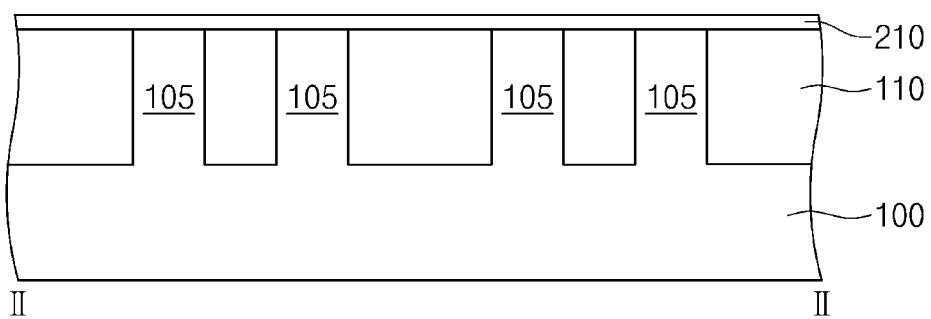
Figure 5B:
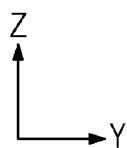

Referring to FIGS. 5A and 5B, mask patterns MP are formed on the substrate 100. The mask patterns MP are formed to have openings that define areas where gate lines (see 200 of FIGS. 2A and 2B) are to be formed as described hereinafter. The mask patterns MP may be hardmask patterns of silicon nitride (SiNx) or photoresist patterns. The mask patterns MP may be used as an etching mask to etch the substrate 100 and the device isolation layer 110 to form trenches 120 with linear shape extending in a second direction Y. The trenches 120 may have bottom surfaces that expose the device isolation layer 110 and the active regions 105.

Gate dielectric patterns 210 are formed in the trenches 120. The gate dielectric patterns 210 may be formed by thermal oxidation, atomic layer deposition (ALD), or chemical vapor deposition (CVD). For example, the gate dielectric patterns 210 may include silicon oxide (SiOx) that is formed on an exposed surface of the substrate 100 when thermal oxidation is performed. In this case, the gate dielectric patterns 210 may be formed on inner walls of the trenches 120. For example, the gate dielectric patterns 210 may conformally cover inner sides (e.g., sidewalls and bottom surfaces) of the trenches 120. As another example, the gate dielectric patterns 210 may include one or more of silicon oxide (SiOx), silicon nitride (SiNx), and silicon oxynitride (SiON) that are formed by low-pressure chemical vapor deposition (LPCVD), plasma-enhanced chemical vapor deposition (PECVD), ultra-high vacuum chemical vapor deposition (UHV-CVD), or atomic layer deposition (ALD). In this case, the gate dielectric patterns 210 may conformally cover the mask patterns MP and the inner sides of the trenches 120.

Figure 6A:
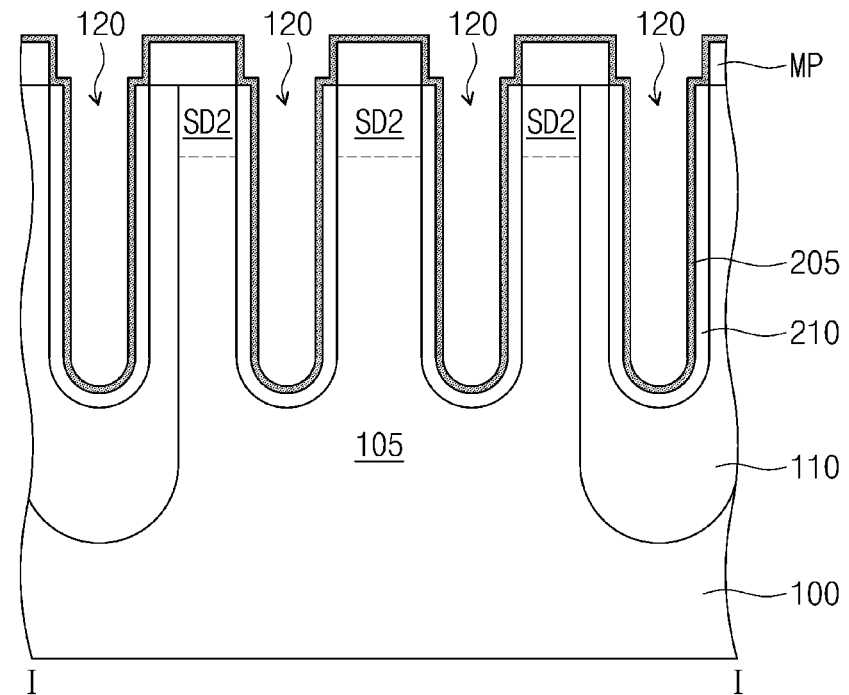
FIGS. 6A and 6B illustrate cross-sectional views respectively taken along lines I-I and II-II of FIG. 1, showing a method of fabricating a semiconductor device according to embodiments of the inventive concepts.
Figure 6B:
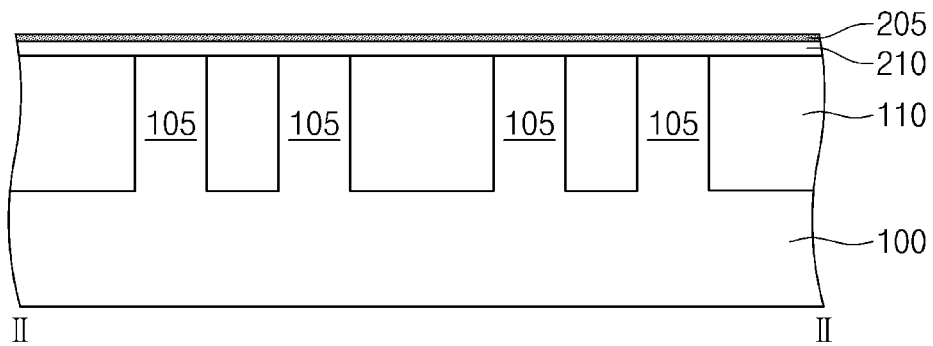

Referring to FIGS. 6A and 6B, a preliminary work-function control layer 205 is formed on the substrate 100. The preliminary work-function control layer 205 may be formed to conformally cover the mask patterns MP and the inner sides of the trenches 120. The preliminary work-function control layer 205 may be formed using various deposition processes, such as chemical vapor deposition (CVD) or atomic layer deposition (ALD). The preliminary work-function control layer 205 may include nitride of a metallic material, or metal nitride. The metallic material may include a metal element different from a work-function control element which will be described hereinafter. For example, the metallic material may include a metal element, such as titanium (Ti) or tantalum (Ta). For example, the metal nitride may include titanium nitride (TiN), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN).

Figure 7A:
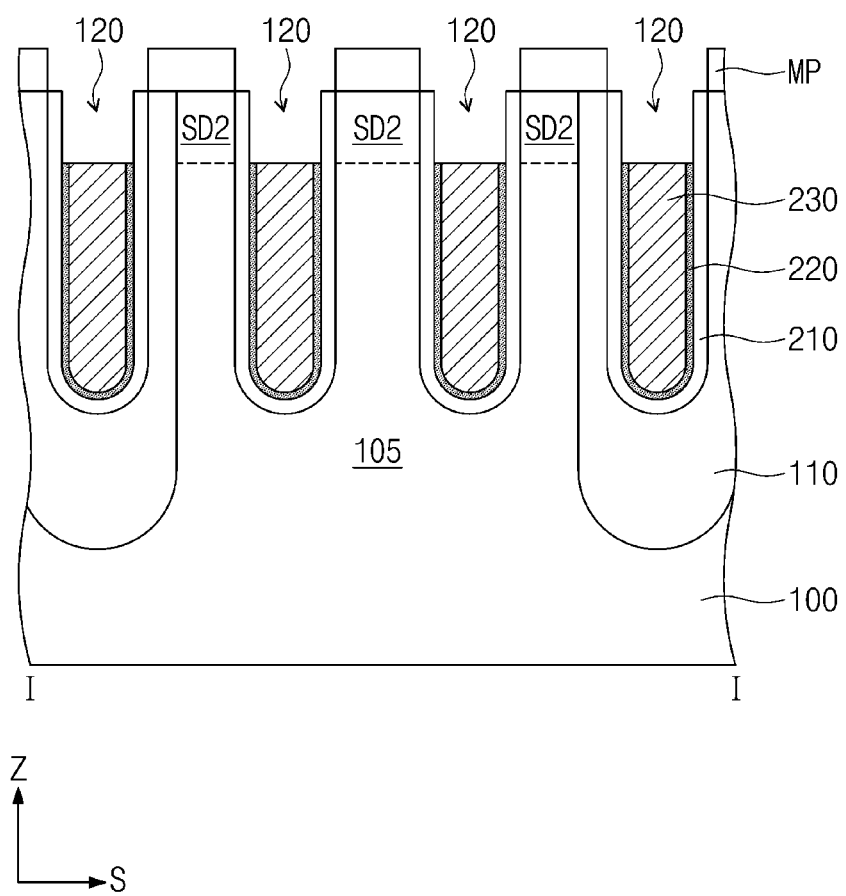
FIGS. 7A and 7B illustrate cross-sectional views respectively taken along lines I-I and II-II of FIG. 1, showing a method of fabricating a semiconductor device according to embodiments of the inventive concepts.
Figure 7B:
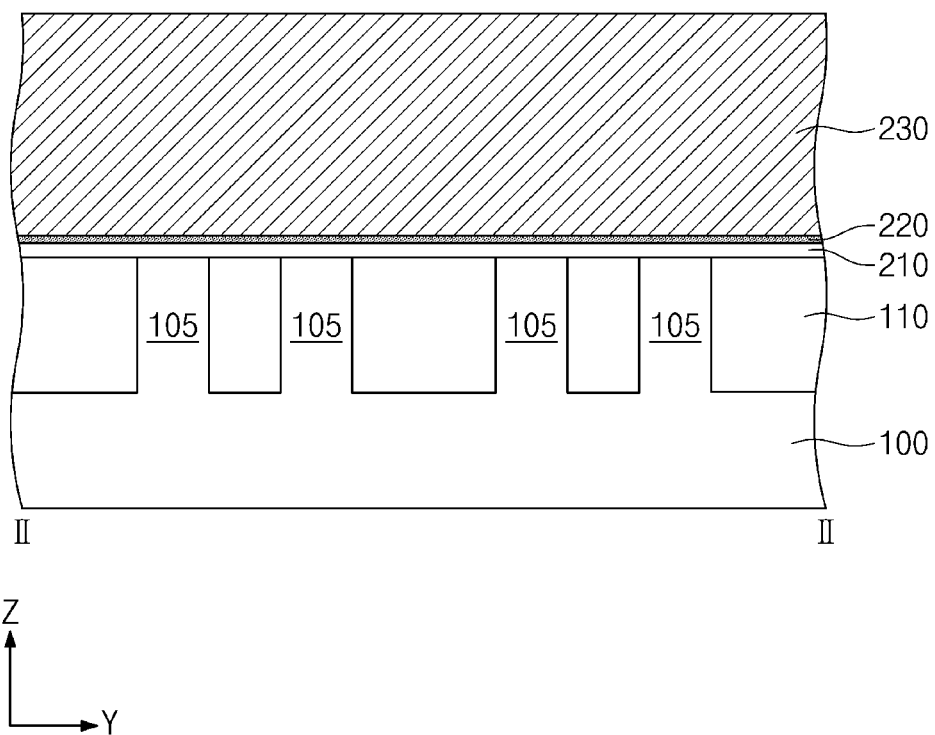

Referring to FIGS. 7A and 7B, conductive layers 230 are formed in lower portions of the trenches 120 in which the preliminary work-function control layer 205 is coated. For example, a conductive material may be deposited on an entire surface of the substrate 100 on which the preliminary work-function control layer 205 is formed. The conductive material may fill the trenches 120. The conductive material may be deposited using various deposition processes, such as chemical vapor deposition (CVD) or atomic layer deposition (ALD). The conductive material may be one of doped semiconductor materials (e.g., doped silicon or doped germanium), conductive metal nitrides (e.g., titanium nitride (TiN) or tantalum nitride (TaN)), metals (e.g., tungsten (W), titanium (Ti), or tantalum (Ta)), and metal-semiconductor compounds (e.g., tungsten silicide ($WSi_2$), cobalt silicide (CoSi), or titanium silicide (TiSi)). The deposited conductive material may undergo an etching process to form the conductive layers 230. The etching process may continue until the conductive material has a desired thickness in the trenches 120.

The preliminary work-function control layer 205 is removed from the mask patterns MP and from portions of the substrate 100 not covered by the conductive layers 230, to form work-function control layers 220. The work-function control layer 220 may be formed to have a top surface at a same level as that of a top surface of the conductive layer 230.

Figure 8A:
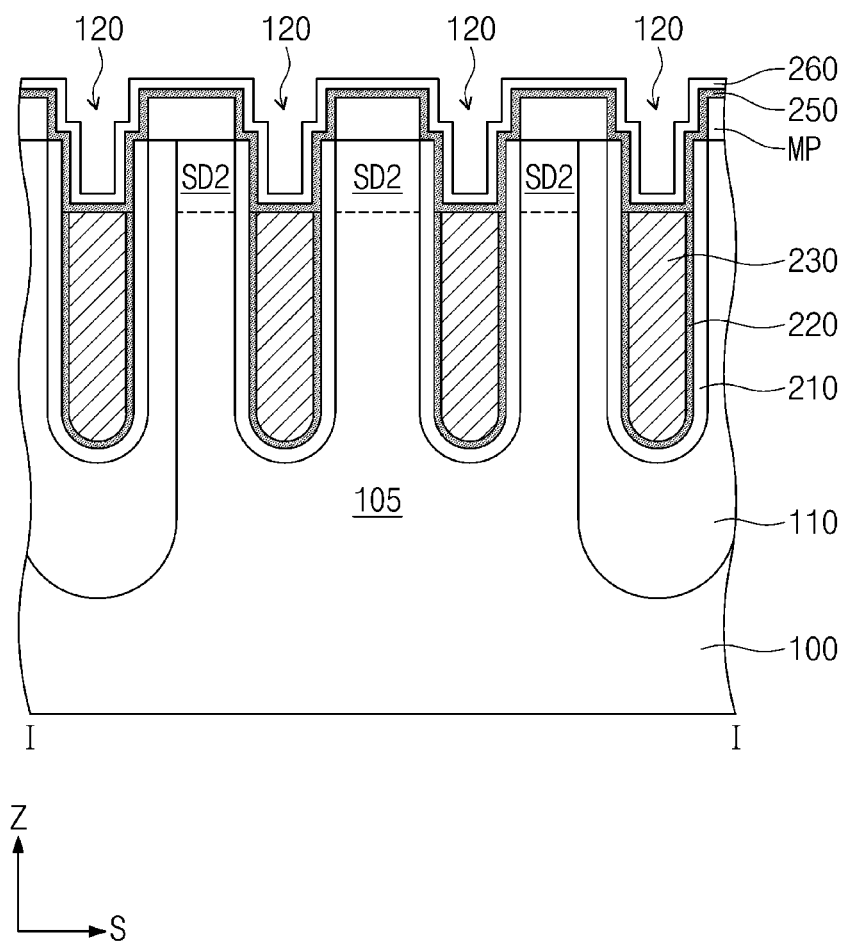
FIGS. 8A and 8B illustrate cross-sectional views respectively taken along lines I-I and II-II of FIG. 1, showing a method of fabricating a semiconductor device according to embodiments of the inventive concepts.
Figure 8B:
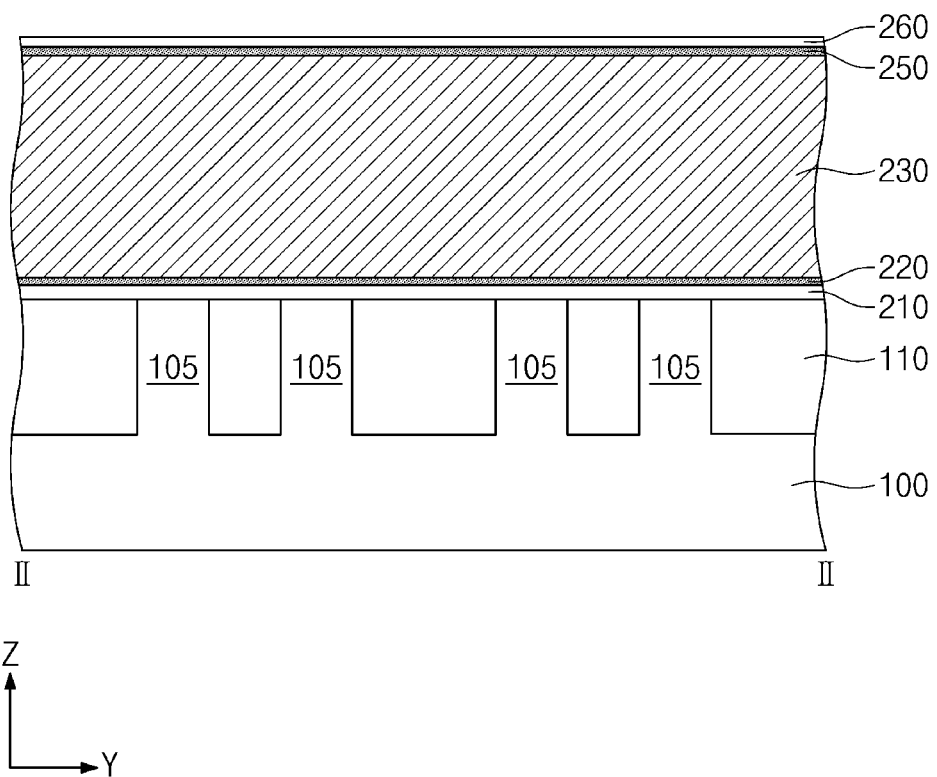

Referring to FIGS. 8A and 8B, a barrier layer 250 is formed on the substrate 100. The barrier layer 250 may be formed to conformally cover the gate dielectric pattern 210, the top surface of the work-function control layer 220, the top surface of the conductive layer 230, and the mask patterns MP. The barrier layer 250 may be in contact with the top surface of the work-function control layer 220 and the top surface of the conductive layer 230. The barrier layer 250 may be formed to have a thickness the same as or greater than that of the work-function control layer 220. The barrier layer 250 may be formed using various deposition processes, such as chemical vapor deposition (CVD) or atomic layer deposition (ALD). The barrier layer 250 may include a metallic material or its nitride. The metallic material may include a metal element different from a work-function control element which will be described hereinafter. The barrier layer 250 may include the same material as that of the work-function control layer 220. For example, the barrier layer 250 may include titanium nitride (TiN), titanium aluminum (TiAl), titanium aluminum nitride (TiAlN), a metal compound containing titanium nitride (TiN), tantalum nitride (TaN), tantalum aluminum nitride (TaAlN), tantalum aluminum carbonitride (TaAlCN), or a metal compound containing tantalum nitride (TaN). Alternatively, the barrier layer 250 may include a different material from that of the work-function control layer 220.

A source layer 260 is formed on the substrate 100. The source layer 260 may be formed to conformally cover a top surface of the barrier layer 250. For example, the barrier layer 250 may be interposed between the gate dielectric pattern 210 and the source layer 260, while extending between the source layer 260 and each of the work-function control layer 220 and the conductive layer 230. The source layer 260 may be formed using various deposition processes, such as chemical vapor deposition (CVD) or atomic layer deposition (ALD). The source layer 260 may include a work-function control element or its compound. For example, the work-function control element may include metal, such as one or more of lanthanum (La), strontium (Sr), antimony (Sb), yttrium (Y), aluminum (Al), tantalum (Ta), hafnium (Hf), iridium (Ir), zirconium (Zr), and magnesium (Mg). When the source layer 260 includes a compound of the work-function control element, the compound of the work-function control element may be oxide or nitride.

Figure 9A:
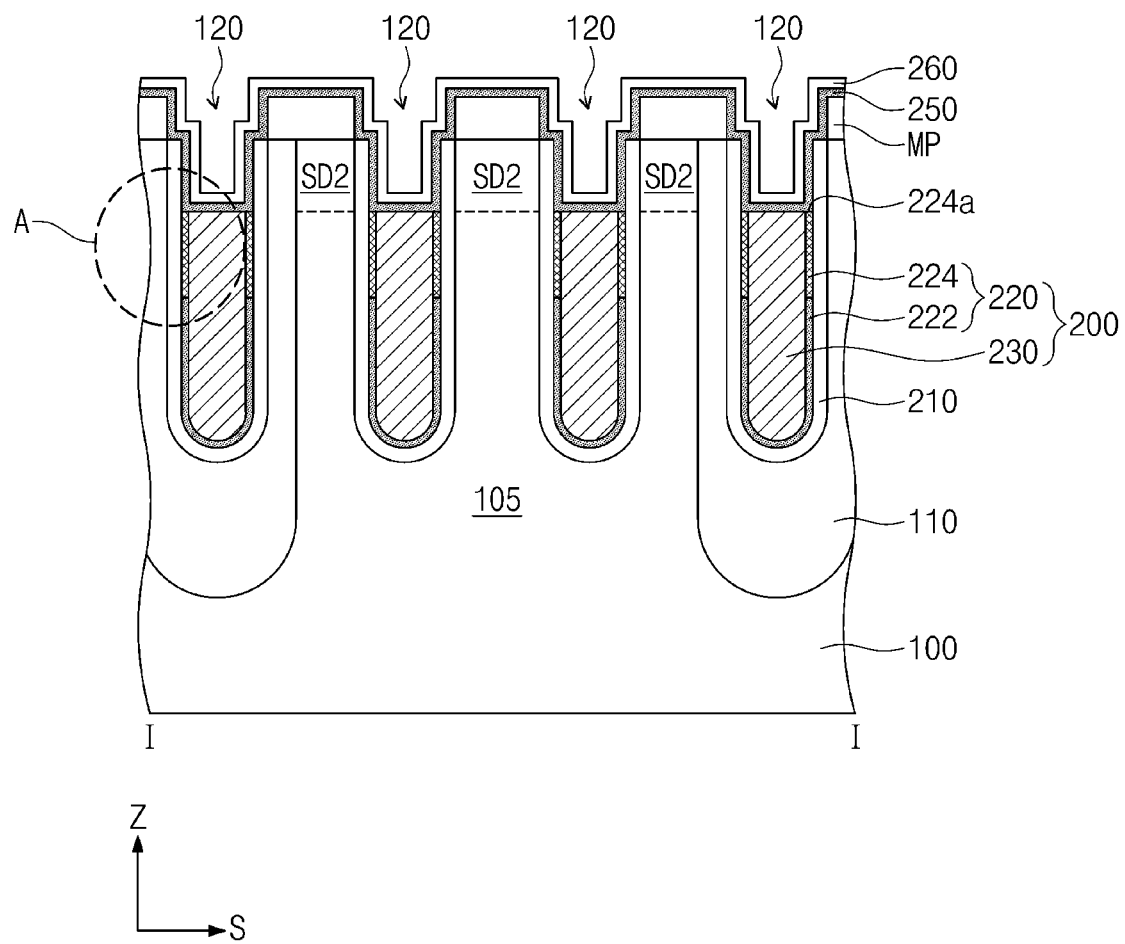
FIGS. 9A and 9B illustrate cross-sectional views respectively taken along lines I-I and II-II of FIG. 1, showing a method of fabricating a semiconductor device according to embodiments of the inventive concepts.
Figure 9B:
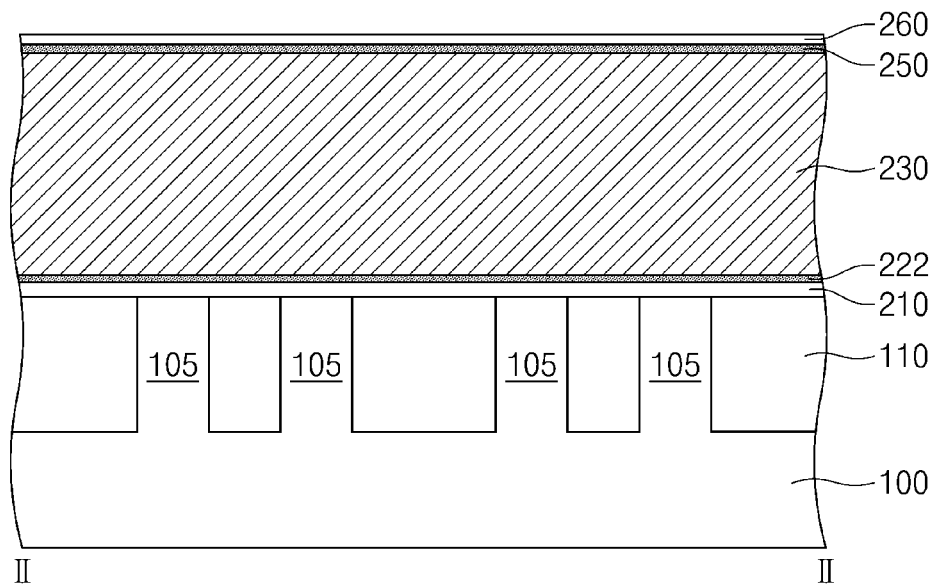
Figure 9B:
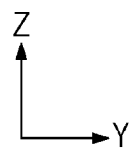
Figure 9C:
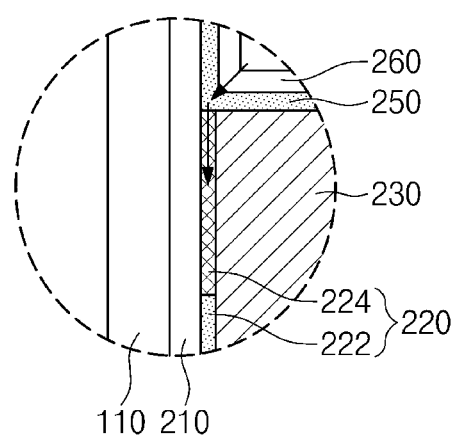
FIG. 9C illustrates an enlarged cross-sectional view of section A in FIG. 9A.

Referring to FIGS. 9A to 9C, the work-function control element is doped into an upper portion of the work-function control layer 220, with the result that a second work-function control part 224 is formed. In this case, a first work-function control part 222 is defined to refer to a lower portion of the work-function control layer 220, which lower portion is not doped with the work-function control element included in the source layer 260. The second work-function control part 224 may have an effective work function lower than that of the first work-function control part 222. For example, the second work-function control part 224 may be formed by a diffusion process in which the work-function control element of the source layer 260 diffuses into the upper portion of the work-function control layer 220. The diffusion process may cause the work-function control element to diffuse, along an arrow shown in FIG. 9C, from the source layer 260 through the barrier layer 250 into the upper portion of the work-function control layer 220. Through the processes above, a gate line 200 may be formed to include the work-function control layer 220 and the conductive layer 230, and to have a higher work function at a lower portion and a lower work function at an upper portion.

According to some embodiments of the inventive concepts, the source layer 260 is separated from the gate dielectric patterns 210 by the barrier layer 250. Therefore, when the diffusion process is performed to diffuse the work-function control element, the barrier layer 250 may prevent the gate dielectric patterns 210 from damage or impact possibly caused by the work-function control element, in contrast to a case that the source layer 260 is in direct contact with the gate dielectric patterns 210.

If the barrier layer 250 is not provided, the source layer 260 would directly contact a top surface of the work-function control layer 220, and the work-function control element would diffuse through an interface between the source layer 260 and the work-function control layer 220. However, a hetero-interface between the source layer 260 and the work-function control layer 220 would have high surface energy and small area. Therefore, a long and/or high energy diffusion process would be necessary to sufficiently diffuse the work-function control element into the upper portion of the work-function control layer 220, which situation may damage components of semiconductor devices.

According to the inventive concepts, a wide interface exists between the barrier layer 250 and the source layer 260, and the wide interface facilitates diffusion between different materials. In addition, because the work-function control layer 220 and the barrier layer 250 include the same or similar material, a high diffusion rate may be achieved on a narrow top surface 224a of the work-function control layer 220. In this sense, the work-function control element may easily diffuse into the upper portion of the work-function control layer 220.

Figure 10A:
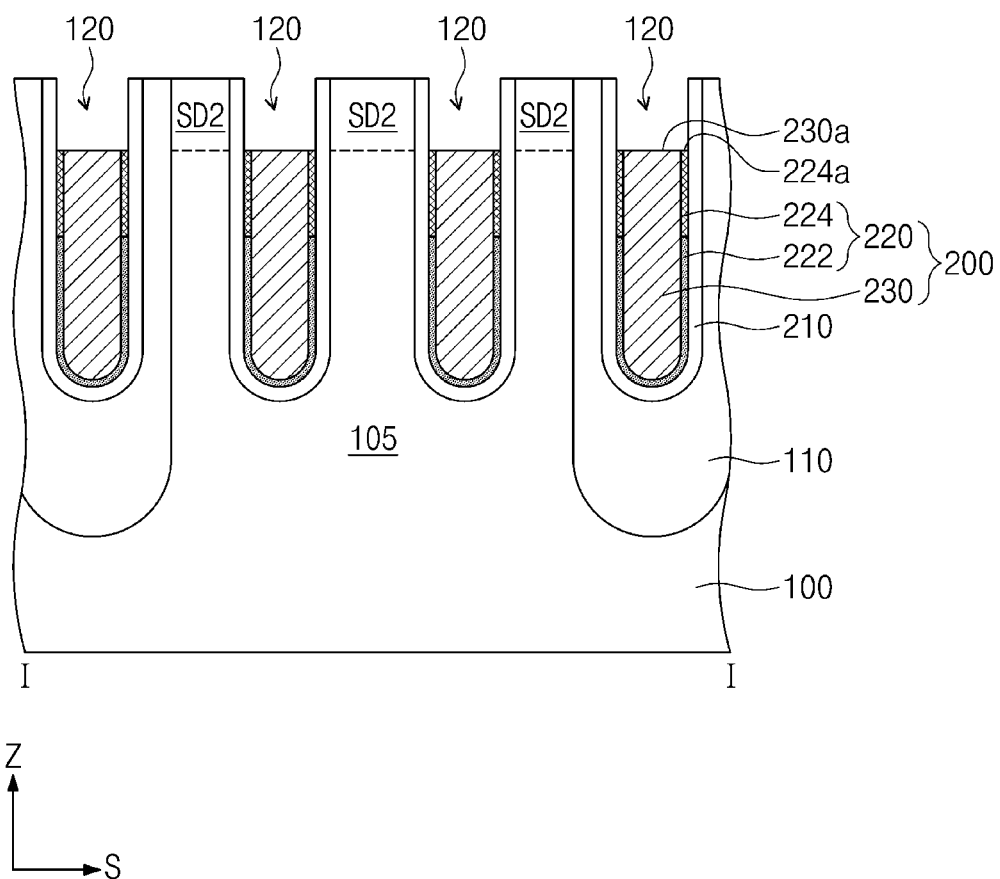
FIGS. 10A and 10B illustrate cross-sectional views respectively taken along lines I-I and II-II of FIG. 1, showing a method of fabricating a semiconductor device according to embodiments of the inventive concepts.
Figure 10B:
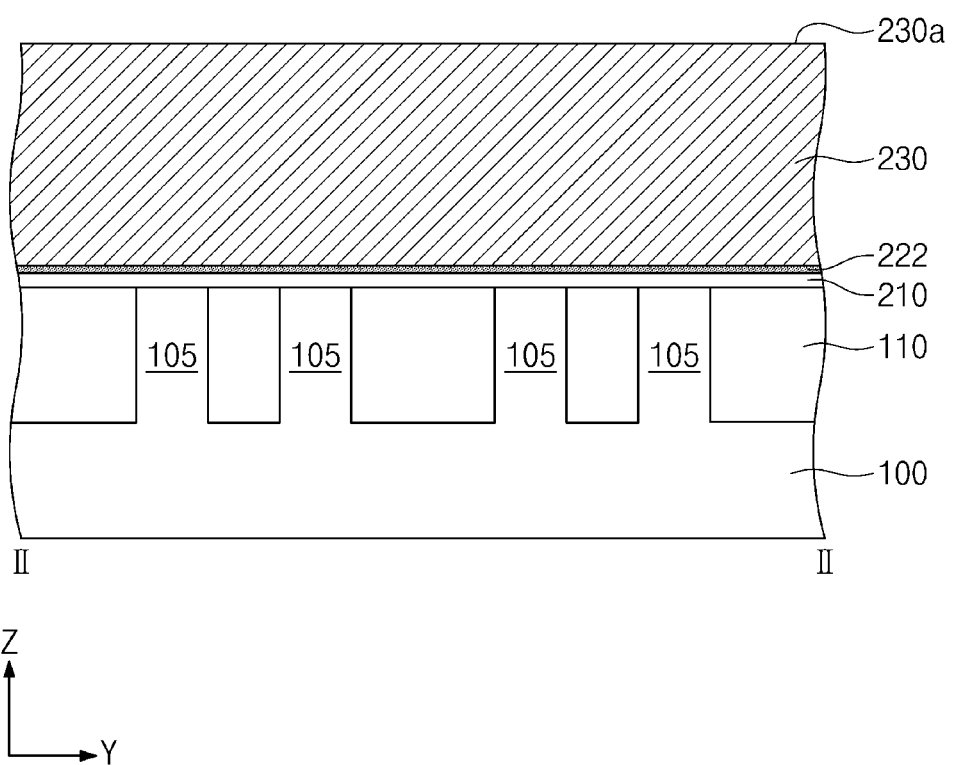

Referring to FIGS. 10A and 10B, the barrier layer 250 and the source layer 260 are removed. The removal of the source layer 260 and the barrier layer 250 may expose the top surface 224a of the work-function control layer 220 and a top surface 230a of the conductive layer 230. The mask patterns MP are also removed together with the barrier layer 250 and the source layer 260. The removal of the mask patterns MP may expose top surfaces of the device isolation layer 110 and the active region 105.

Figure 11A:
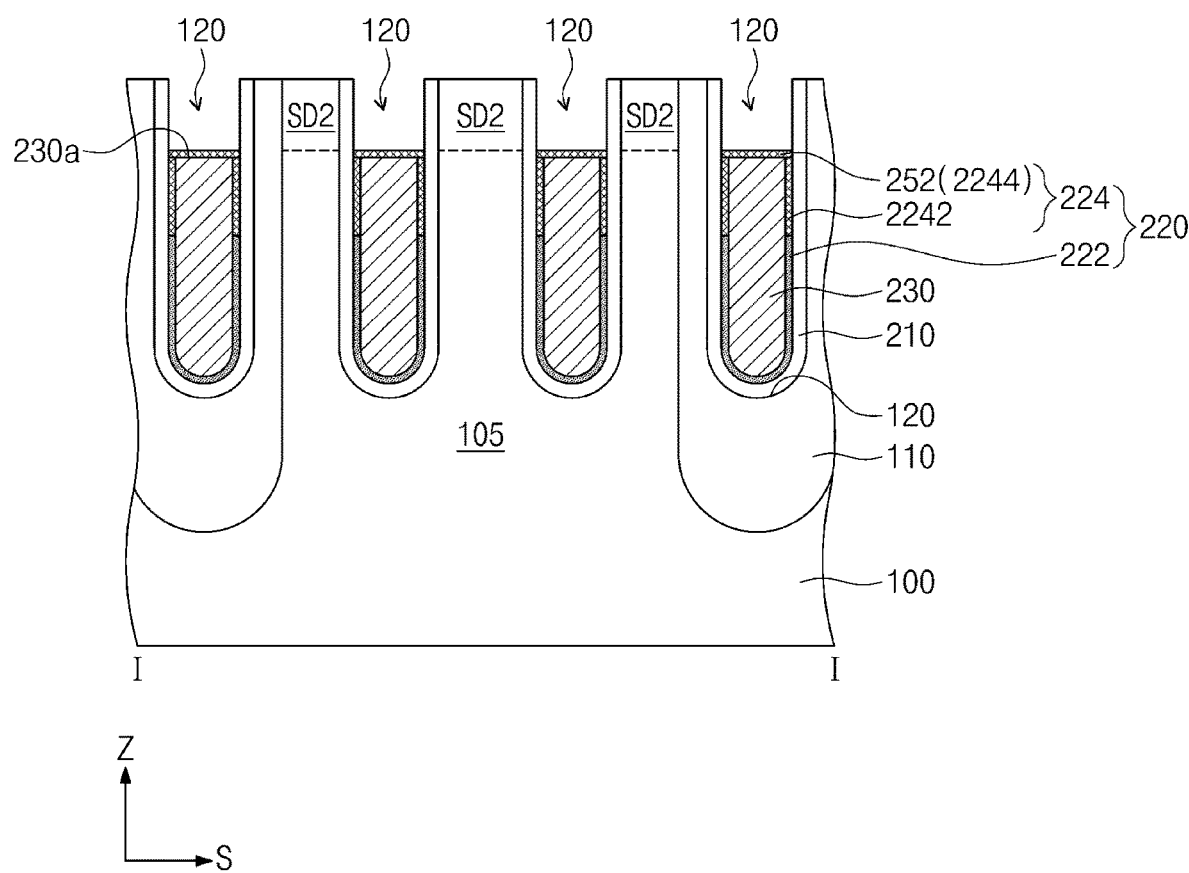
FIGS. 11A and 11B illustrate cross-sectional views respectively taken along lines I-I and II-II of FIG. 1, showing a method of fabricating a semiconductor device according to embodiments of the inventive concepts.
Figure 11B:
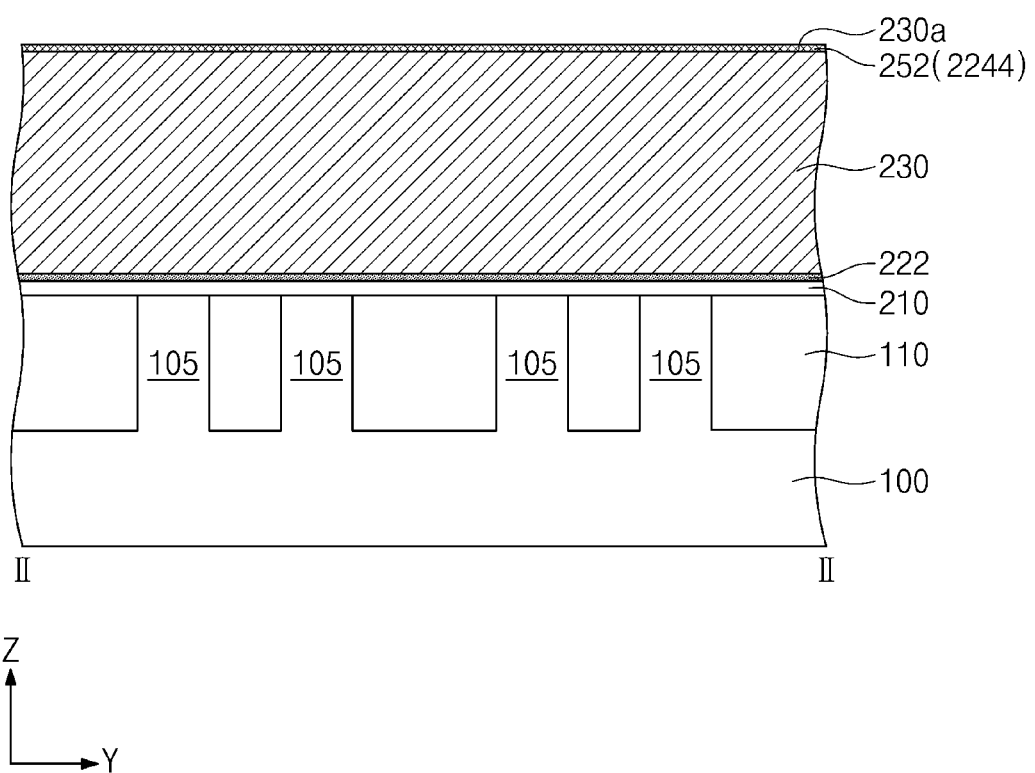

In other embodiments, as shown in FIGS. 11A and 11B, the barrier layer 250 includes a bottom segment 252 that is not removed but remains. The bottom segment 252 of the barrier layer 250 may cover the top surface 230a of the conductive layer 230 and contact the top surface of the work-function control layer 220. The bottom segment 252 of the barrier layer 250 may include the work-function control element and have a lower work function than that of the first work-function control part 222. When the barrier layer 250 includes the same material as that of the work-function control layer 220 or of the second work-function control part 224 in particular, the second work-function control part 224 and the bottom segment 252 of the barrier layer 250 may have a continuous configuration and an invisible interface therebetween. In this case, the bottom segment 252 of the barrier layer 250 may correspond to an upper segment 2244 of the second work-function control part 224. Alternatively, when the barrier layer 250 and the second work-function control part 224 include different materials, a visible interface may be provided between the second work-function control part 224 and the bottom segment 252 of the barrier layer 250. When the bottom segment 252 of the barrier layer 250 remains without being removed, the work-function control layer 220 may have a structure as described with reference to FIGS. 3A and 3B. The following will describe an example in which the barrier layer 250 does not include the bottom segment 252.

Figure 12A:
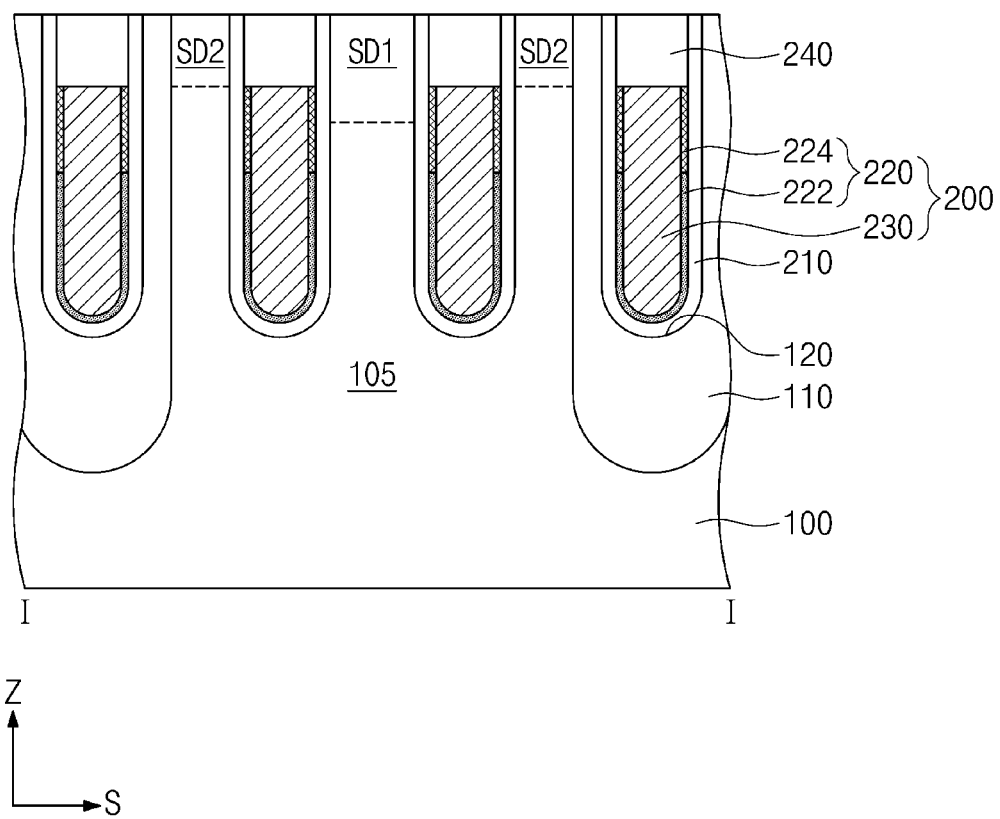
FIGS. 12A and 12B illustrate cross-sectional views respectively taken along lines I-I and II-II of FIG. 1, showing a method of fabricating a semiconductor device according to embodiments of the inventive concepts.
Figure 12B:
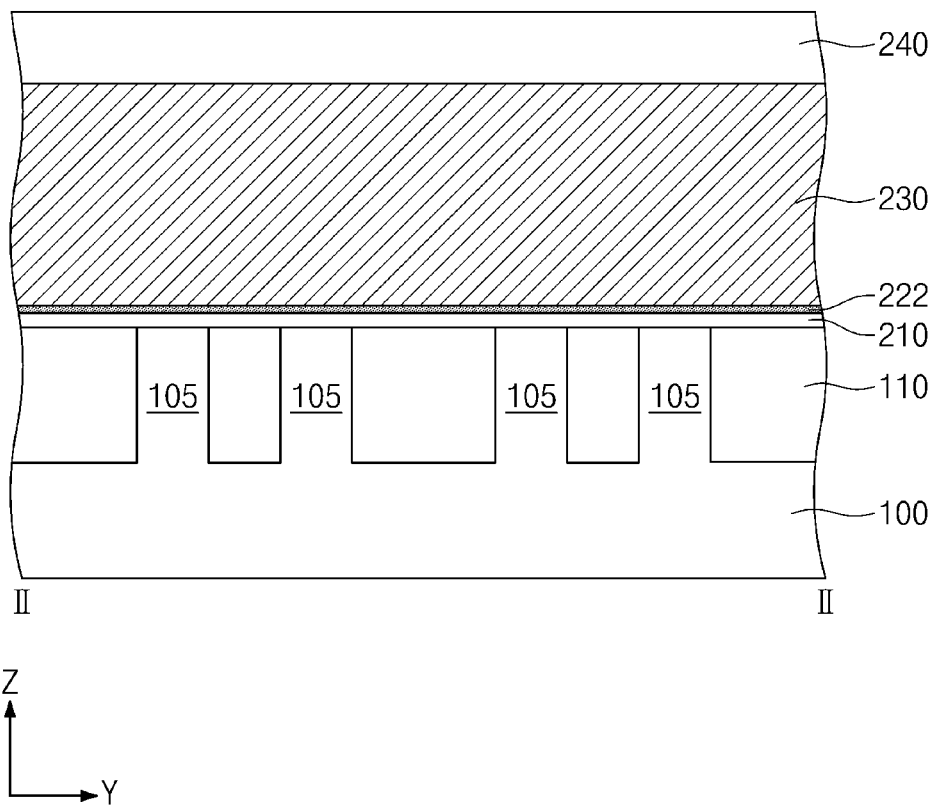

Referring to FIGS. 12A and 12B, first capping patterns 240 are formed in the trenches 120. For example, the first capping patterns 240 may be formed by forming a capping layer on the entire surface of the substrate 100 and then performing a planarization process. The first capping patterns 240 may include one or more of silicon oxide (SiOx), silicon nitride (SiNx), and silicon oxynitride (SiON).

The substrate 100 undergoes an ion implantation process to form first impurity regions SD1 in the active regions 105 each between two neighboring gate lines 200. The first impurity regions SD1 may be doped with N-type impurities the same as those of the second impurity regions SD2. The first impurity regions SD1 may extend further into the substrate 100 than the second impurity regions SD2.

Referring back to FIGS. 2A and 2B, first pads 310 and second pads 320 are formed by forming and patterning an impurity-doped polysilicon layer, an impurity-doped single crystalline silicon layer, or a conductive layer on the substrate 100. The first pads 310 are connected to the first impurity regions SD1, and the second pads 320 are connected to the second impurity regions SD2. When the first and second pads 310 and 320 include an impurity-doped polysilicon layer or an impurity-doped single crystalline silicon layer, the first and second pads 310 and 320 may be doped with impurities having conductive type the same as that of the first and second impurity regions SD1 and SD2.

A first interlayer dielectric layer 400 is formed on the first and second pads 310 and 320. The first interlayer dielectric layer 400 may be formed using chemical vapor deposition (CVD) or the like. The first interlayer dielectric layer 400 may include one or more of silicon oxide (SiOx), silicon nitride (SiNx), and silicon oxynitride (SiON). The first interlayer dielectric layer 400 may be partially patterned to form contact holes defining areas filled with direct contacts 520 which will be described hereinafter. The first interlayer dielectric layer 400 may be coated thereon with a conductive material filling the contact holes, and a capping layer may be formed on the conductive material. For example, the conductive material may include a conductive material, such as metal or doped semiconductor. For example, the capping layer may include one or more of silicon oxide (SiOx), silicon nitride (SiNx), and silicon oxynitride (SiON). The capping layer and the conductive material are patterned to form bit lines 510 and second capping patterns 530 disposed on the bit lines 510. Direct contacts 520 are formed in the contact holes. A dielectric spacer layer may be conformally deposited on the first interlayer dielectric layer 400, and then anisotropically etched to form dielectric spacers 540 covering opposite sidewalls of each bit line 510. The dielectric spacers 540 may include one or more of silicon oxide (SiOx), silicon nitride (SiNx), and silicon oxynitride (SiON).

A second interlayer dielectric layer 550 is formed on the first interlayer dielectric layer 400, and then a planarization process may be performed to expose top surfaces of the second capping patterns 530. Thereafter, buried contacts 610 are formed to penetrate the second and first interlayer dielectric layers 550 and 400 and to have connection with the second pads 320. The buried contacts 610 may include a conductive material, such as doped silicon or metal. A support layer 700 is formed on the second interlayer dielectric layer 550. The support layer 700 may include one or more of silicon oxide (SiOx), silicon nitride (SiNx), and silicon oxynitride (SiON). The support layer 700 may be formed using various deposition processes, such as chemical vapor deposition (CVD) or atomic layer deposition (ALD). First electrodes 620 are formed to penetrate the support layer 700 and to have connection with the buried contacts 610. The first electrodes 620 are formed into a cylindrical shape having a closed bottom. A dielectric layer 630 is formed to conformally cover the first electrodes 620, and a second electrode 640 is formed to commonly cover the first electrodes 620, forming capacitors CA. The first and second electrodes 620 and 640 may include impurity-doped silicon, metal, or metal compound. The processes above may be used to fabricate a semiconductor device according to embodiments of the inventive concepts.

According to some embodiments of the inventive concepts, a semiconductor device may include work-function control layers having portions which are provided on upper portions of gate lines. These portions of the work-function control layers are formed to have a lower work function to thus reduce a gate induced drain leakage (GIDL) current flowing toward impurity regions from the upper portions of the gate lines.

Furthermore, according to some embodiments of the inventive concepts, the work function may be reduced at the upper portions of the gate lines to reduce the GIDL current, whereas the work function is not reduced at lower portions of the gate lines so that the semiconductor device may maintain a higher threshold voltage at the lower portions below which channels are formed.

In a method of fabricating a semiconductor device according to some embodiments of the inventive concepts, when a diffusion process is performed to diffuse a work-function control element, a barrier layer may prevent gate dielectric patterns from damage or impact possibly caused by the work-function control element, in contrast to a case that a source layer directly contacts the gate dielectric patterns.

Moreover, a wide interface may exist between the barrier layer and the source layer that facilitates diffusion between different materials. In addition, a high diffusion rate may be achieved on a narrow top surface of the work-function control layer. In this sense, the work-function control element may easily diffuse into an upper portion of the work-function control layer.

Although the inventive concepts have been described in connection with some example embodiments as taken with the accompanying drawings, it should be understood by one of ordinary skill in the art that variations in form and detail may be made therein without departing from the spirit and features of the inventive concepts. The above disclosed embodiments should thus be considered illustrative and not restrictive.

What is claimed is:

1. A method of fabricating a semiconductor device, the method comprising:

forming a device isolation layer on a substrate, the device isolation layer defining a plurality of active regions; and forming a plurality of gate lines intersecting the active regions and buried in the substrate, wherein forming a gate line from among the plurality of gate lines comprises forming a trench on the substrate, the trench intersecting the active regions, forming a work-function control layer on a sidewall and a bottom surface of the trench, forming a conductive layer on the work-function control layer, sequentially forming a barrier layer and a source layer on the work-function control layer and on the conductive layer, the source layer including a work-function control element, and diffusing the work-function control element from the source layer into an upper portion of the work-function control layer.

2. The method of claim 1, wherein a work function of the upper portion of the work-function control layer containing the diffused work-function control element is lower than a work function of a lower portion of the work-function control layer.

3. The method of claim 1, wherein the work-function control element diffuses through the barrier layer into the work-function control layer.

4. The method of claim 3, wherein the barrier layer contains the work-function control element.

5. The method of claim 1, further comprising forming a gate dielectric pattern on the sidewall and the bottom surface of the trench, before the forming the work-function control layer.

6. The method of claim 5, wherein the barrier layer is disposed between the gate dielectric pattern and the source layer.

7. The method of claim 6, wherein the barrier layer extends from between the gate dielectric pattern and the source layer to between the source layer and each of the work-function control layer and the conductive layer.

8. The method of claim 1, wherein a thickness of the barrier layer is greater than a thickness of the work-function control layer.

9. The method of claim 1, wherein the barrier layer includes a material that is the same as a material of the work-function control layer.

10. The method of claim 1, further comprising etching the work-function control layer and the conductive layer, before the forming the barrier layer and the source layer, and wherein after the etching the work-function control layer and the conductive layer a top surface of the work-function control layer is coplanar with a top surface of the conductive layer.

11. The method of claim 10, wherein the barrier layer is formed to contact the top surface of the work-function control layer and the top surface of the conductive layer.

12. The method of claim 1, further comprising removing the barrier layer and the source layer on the work-function control layer and the conductive layer, after the diffusing the work-function control element.

13. The method of claim 12, wherein the removing the barrier layer and the source layer comprises removing a portion of the barrier layer so that a bottom segment of the barrier layer remains in contact with a top surface of the work-function control layer and a top surface of the conductive layer.

14. The method of claim 13, wherein the bottom segment of the barrier layer that remains and the upper portion of the work-function control layer include a same material and are connected into a single body.

15. A method of fabricating a semiconductor device, the method comprising:

forming a gate dielectric pattern on a bottom surface and a lateral surface of a trench in a substrate;

forming a gate line on the gate dielectric pattern, the gate line filling a lower portion of the trench and including a conductive layer and a work-function control layer surrounding a lateral surface of the conductive layer;

forming a barrier layer on an exposed inner surface of the gate dielectric pattern and on the gate line;

forming a source layer on the barrier layer, the source layer covering the gate line and including a work-function control element; and diffusing the work-function control element from the source layer to an upper portion of the work-function control layer so that a work function of the upper portion of the work-function control layer is lower than a work function of a lower portion of the work-function control layer.

16. The method of claim 15, wherein the work-function control element diffuses through the barrier layer into the work-function control layer.

17. The method of claim 15, wherein the barrier layer contains the work-function control element.

18. The method of claim 15, wherein the barrier layer extends from between the gate dielectric pattern and the source layer to between the source layer and each of the work-function control layer and the conductive layer.

19. The method of claim 15, wherein a thickness of the barrier layer is greater than a thickness of the work-function control layer.

20. The method of claim 15, wherein a top surface of the work-function control layer is coplanar with a top surface of the conductive layer.

* * * * *